United States Patent
Yao et al.

(10) Patent No.: US 10,249,515 B2
(45) Date of Patent: Apr. 2, 2019

(54) ELECTRONIC DEVICE PACKAGE

(71) Applicant: Intel Corporation, Santa Clara, CA (US)

(72) Inventors: Jimin Yao, Chandler, AZ (US); Eric Li, Chandler, AZ (US); Shawna Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/089,136

(22) Filed: Apr. 1, 2016

(65) Prior Publication Data
US 2017/0287735 A1    Oct. 5, 2017

(51) Int. Cl.
| | | |
|---|---|---|
| *H01L 21/56* | (2006.01) | |
| *H01L 23/31* | (2006.01) | |
| *H01L 21/60* | (2006.01) | |

(52) U.S. Cl.
CPC .......... *H01L 21/563* (2013.01); *H01L 21/565* (2013.01); *H01L 23/3185* (2013.01); *H01L 2021/60022* (2013.01)

(58) Field of Classification Search
CPC .... H01L 23/48; H01L 23/495; H01L 23/3185
See application file for complete search history.

(56) References Cited

U.S. PATENT DOCUMENTS

| | | | | |
|---|---|---|---|---|
| 5,128,746 A | * | 7/1992 | Pennisi | B23K 35/3613 257/673 |
| 6,002,168 A | * | 12/1999 | Bellaar | H01L 23/49816 257/693 |
| 6,058,021 A | * | 5/2000 | Yamamoto | H01L 21/563 174/260 |
| 6,794,739 B2 | * | 9/2004 | Kobayashi | H01L 23/24 257/673 |
| 6,940,182 B2 | * | 9/2005 | Hilton | H01L 21/563 257/787 |
| 6,995,476 B2 | * | 2/2006 | Hashimoto | H01L 21/4853 257/787 |
| 7,898,093 B1 | * | 3/2011 | Darveaux | H01L 21/56 257/678 |
| 9,030,030 B2 | * | 5/2015 | Lee | H01L 21/563 257/783 |

(Continued)

FOREIGN PATENT DOCUMENTS

| | | |
|---|---|---|
| WO | WO 2013/101668 A1 | 7/2013 |
| WO | WO 2014/121090 A1 | 8/2014 |

OTHER PUBLICATIONS

International search report for PCT application No. PCT/US2017/020282 filed Mar. 1, 2017; dated Jun. 20, 2017; 11 pages.

*Primary Examiner* — Peniel M Gumedzoe
(74) *Attorney, Agent, or Firm* — Thorpe North and Western, LLP; David W. Osborne

(57) ABSTRACT

Electronic device package technology is disclosed. In one example, an electronic device package can include a substrate, an electronic component disposed on the substrate and electrically coupled to the substrate, and an underfill material disposed at least partially between the electronic component and the substrate. A lateral portion of the underfill material can comprises a lateral surface extending away from the substrate and a meniscus surface extending between the lateral surface and the electronic component.

9 Claims, 5 Drawing Sheets

(56) References Cited

U.S. PATENT DOCUMENTS

| | | | |
|---|---|---|---|
| 2003/0203542 A1* | 10/2003 | Chee | H01L 21/563 438/118 |
| 2005/0023033 A1* | 2/2005 | Saiki | H01L 23/49827 174/260 |
| 2008/0142996 A1 | 6/2008 | Subramanian et al. | |
| 2011/0001233 A1* | 1/2011 | Iwase | H01L 21/563 257/737 |
| 2011/0147912 A1* | 6/2011 | Karpur | H01L 21/563 257/687 |
| 2014/0110836 A1* | 4/2014 | Tsai | H01L 23/3135 257/737 |

* cited by examiner

ELECTRONIC DEVICE PACKAGE

TECHNICAL FIELD

Embodiments described herein relate generally to electronic device packages, and more particularly to controlling the flow of an underfill material over the surface of an electronic device package substrate.

BACKGROUND

Electronic devices, which include a chip component joined to a substrate, are often vulnerable to crack formation. In particular, cracks tend to appear along the bond lines around attachment structures such as bumps, including either between the bump and the component or between the bump and the substrate. Cracks may occur in manufacturing or use when the materials of the substrate and/or electronic device are subjected to thermal cycling and expand and contract at different rates. Such cracks are a major source of device failure in chip components. In addition, mechanical stress due to coefficient of thermal expansion (CTE) mismatch can cause delamination in multiple device stack layers on a die. Underfill techniques and materials are extensively used in semiconductor manufacturing in an effort to stabilize chip components and help prevent device failure.

One common underfill technique is "capillary underfill". Capillary underfill typically involves flowing an adhesive material between the component and the substrate, so that it contacts both the component and the substrate as it is drawn into and through an intervening gap by a wicking action. When functioning properly, the underfill will migrate completely beneath the component, displacing all air and reaching to all the edges of the chip component. The underfill may then be cured to form a substantially rigid material surrounding and strengthening each attachment joint. This can allow the materials to better withstand the stresses applied to attachment structure bond lines during thermal variation, and protect against delamination in multiple device stack layers on a die. At each edge of the component, a generally concave fillet of underfill material may form, extending from the component to the substrate surface only a short distance beyond the peripheral boundary of the component.

After it is dispensed, the flowable adhesive may flow not only into and through the gap between the component and the substrate, but also away from the dispense point and the component, across the surface of the substrate. Once cured, this "counter-directional" flow forms an "extended fillet" of underfill material. This generally unimpeded flow away from the component necessitates, in many instances, the use of more underfill than is necessary to simply fill the component-substrate gap, and the underfill material comprising the extended fillet is essentially wasted. Further, the area covered by the extended fillet is generally designated a "keep out zone" (KOZ) into which no other components are placed to avoid potentially damaging them. Therefore, on the side of a chip component where an extended fillet of underfill material forms, the substrate surface area beneath the extended fillet is effectively made unavailable for component placement and essentially wasted.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
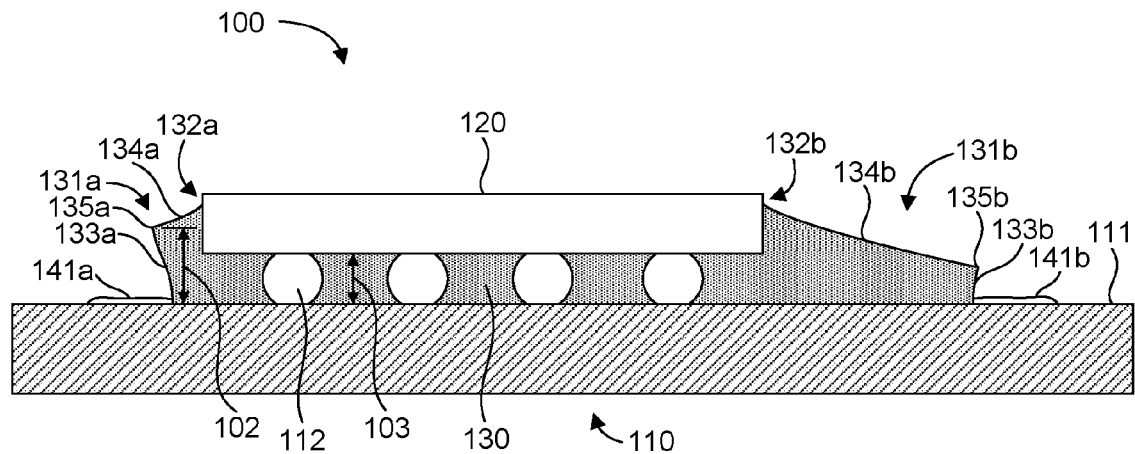
FIG. 1 illustrates a schematic representation of a side cross-sectional view of an electronic device package in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used to describe particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that support in this specification for numerical values used in connection with the term "about" is also provided for the exact numerical value itself as though "about" were not used.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

For the reasons mentioned above it is highly desirable to minimize or eliminate the underfill KOZ. The benefits of minimizing or eliminating the underfill KOZ include the ability to reduce package size and increase the package lay out density. These advantages and others can significantly reduce package cost.

Accordingly, electronic device packages are disclosed in which barriers used to control the flow and spread of underfill material do not contribute or factor into the underfill KOZ. In one embodiment, this is accomplished by removing the barriers, which may be facilitated by forming the barriers with sacrificial material, such as material that is readily decomposed or dissolved. As a result, in one example, an electronic device package can include a substrate, an electronic component disposed on the substrate and electrically coupled to the substrate, and an underfill material disposed at least partially between the electronic component and the substrate. A lateral portion of the underfill material can comprise a lateral surface extending away from the substrate and a meniscus surface extending between the lateral surface and the electronic component. In another example, an electronic device package can include a substrate, an electronic component disposed on the substrate and electrically coupled to the substrate, and an underfill material disposed at least partially between the electronic component and the substrate. A lateral portion of the underfill material extends from a lateral side of the electronic component to the substrate. The lateral portion of the underfill material can have an edge between two surfaces of the underfill material. In yet another example, an electronic device package can include a substrate, an electronic component disposed on the substrate and electrically coupled to the substrate, and an underfill material disposed at least partially between the electronic component and the substrate. The underfill material can have a lateral portion that extends from a lateral side of the electronic component to the substrate. In addition, the electronic device package can include a sacrificial material residue remaining from a barrier on at least one of the substrate and the lateral portion of the underfill material.

Figure 2:
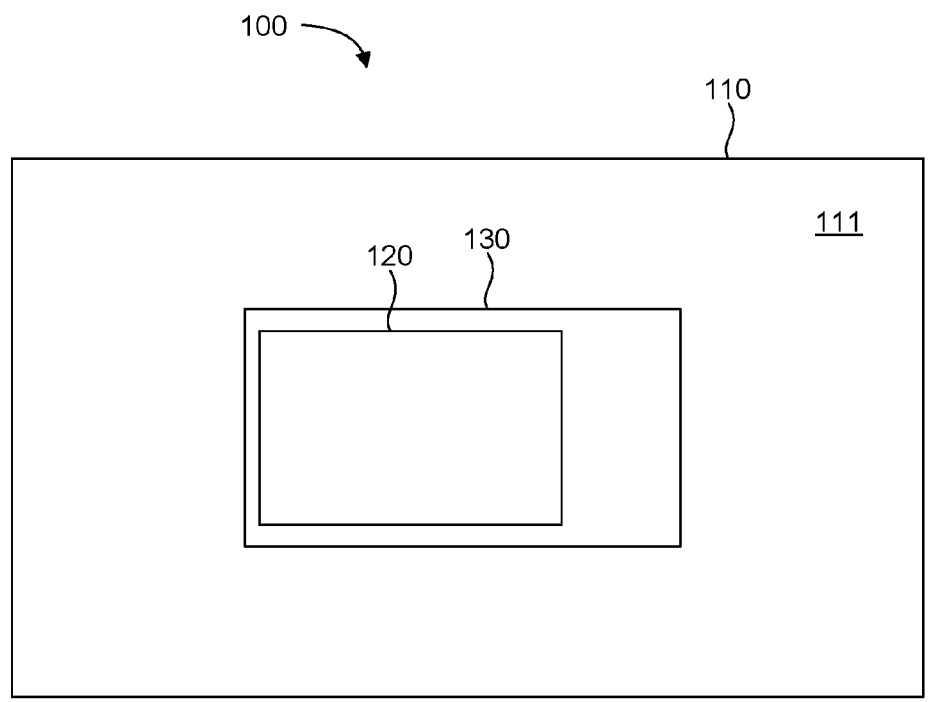
FIG. 2 illustrates a schematic representation of a top view of the electronic device package of FIG. 1.

Referring to FIGS. 1 and 2, an exemplary electronic device package 100 is illustrated. In general, the electronic device package 100 can include a substrate 110 and an electronic component 120 disposed or mounted on the substrate 110, such as on a top surface 111 of the substrate 110. The electronic component 120 can be any electronic device or component that may be included in an electronic device package, such as a semiconductor device (e.g., a die, a chip, or a processor). The substrate 110 is represented generally and may be a multilayer substrate including a number of alternating layers of metallization and dielectric material (not shown). Each layer of metallization can comprise a number of conductors (e.g., traces), and these conductors may comprise any suitable conductive material, such as copper or a copper alloy. Further, each metal layer can be separated from adjacent metal layers by the dielectric layers, and adjacent metal layers may be electrically interconnected by conductive vias. The dielectric layers may comprise any suitable insulating material (e.g., polymers, including both thermoplastic and thermosetting resins or epoxies, ceramics, etc.) and the alternating layers of metal and dielectric material may be built-up over a core layer of a dielectric material (or perhaps a metallic core). The substrate 110 can also include a solder resist material or other surface treatment forming an outer layer of the substrate. The electronic component 120 can be mounted to the substrate 110 in any suitable manner, such as using a conventional flip chip technology in which solder bumps 112 are located between the electronic component 120 and the substrate 110 to electrically couple the electronic component 120 and the substrate 110.

The electronic device package 100 can also include an underfill material 130 disposed at least partially between the electronic component 120 and the substrate 110. The underfill material 130 is typically a polymer (e.g., an epoxy) typically applied between the electronic component 120 and the substrate 110 as an underfill encapsulant. The underfill material 130 surrounds the solder bumps 112 and acts to protect the bumps and connection between the electronic component 120 and substrate 110, as well as support the electronic component 120 on the substrate 110. A lateral portion 131a, 131b of the underfill material 130 can extend from a lateral side 132a, 132b of the electronic component 120 to the substrate 110. The lateral portion 131a, 131b of the underfill material 130 can have a lateral surface 133a, 133b extending away from the substrate 110. The lateral portion 131a, 131b can also have a meniscus surface 134a, 134b extending between the lateral surface 133a, 133b and the electronic component 120. In one aspect, the lateral surface 133a, 133b, can intersect the meniscus surface 134a, 134b. In one aspect, the lateral portion 131a, 131b of the underfill material can have an edge 135a, 135b between the lateral surface 133a, 133b and the meniscus surfaces 134a, 134b of the underfill material 130. In other words, in some aspects, an intersection of the meniscus surface 134a, 134b and the lateral surface 133a, 133b can define the edge 135a, 135b.

As described in more detail below, the lateral surface 133a, 133b can be formed by the underfill material 130 interfacing with a barrier that mechanically inhibits (e.g., physically dams or blocks) the flow and spread of the underfill material outward from the electronic component 120. The barrier can be configured to establish or define a "keep out zone" into which no other components are placed, so that such other components can avoid contact with the underfill material, which may be undesirable. Once the underfill material has cured or solidified, the barrier can be removed, which can facilitate the placement of components in the same location where a barrier previously existed. Accordingly, in one aspect, the lateral surface 133a, 133b can be exposed due to the removal of the barrier, although the lateral surface 133a, 133b may be covered by a material (e.g., a mold compound) that may encapsulate one or more components of the package. Thus, in the context of the present disclosure, the lateral surface 133a, 133b is exposed when the structure or material that formed or created the surface is absent, notwithstanding a subsequent covering by another material after removal of the formation structure. Such formation structures (e.g., barriers) can be made in any suitable manner, some examples of which are disclosed herein. In some embodiments, barriers can be formed in a manner that creates an uneven or irregular surface that interfaces with the underfill material. Thus, the lateral surface resulting from an interface with such a material can also have an uneven or irregular surface. A barrier can be located in any suitable position relative to the electronic component 120. In some cases, the barrier can dam or block the flow of the underfill material 130 such that a height 102 of the lateral surface 133*a* from the substrate 110 is greater than a gap 103 between the electronic component 120 and the substrate 110. To facilitate removal of the barrier or lateral surface formation structure, such structures can be made of a sacrificial material. Because the barrier or lateral surface formation structure is removed, a sacrificial material residue (e.g., trace material or a stain) 141*a*, 141*b* can remain from the barrier on the substrate 110 and/or the lateral portion 131*a*, 131*b* of the underfill material 130 (e.g., the lateral surface 133*a*, 133*b*).

FIGS. 3-12 illustrate aspects of exemplary methods or processes for making an electronic device package, such as the electronic device package 100. These figures also illustrate aspects of a method for facilitating an underfill material keep out zone of an electronic component.

Figure 3:
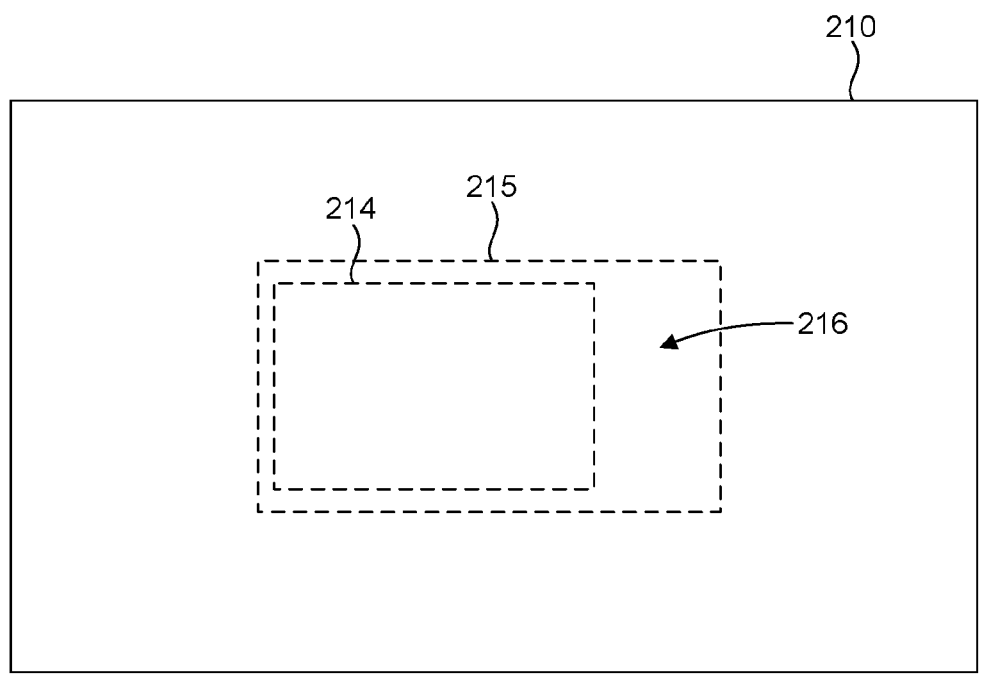
FIG. 3 illustrates a schematic representation of a top view of a substrate in accordance with an example of a method for making an electronic device package.

FIG. 3 schematically illustrates a top view of a substrate 210 to which an electronic component can be coupled. The substrate 210 can have an electronic component attachment area 214, shown bounded by a dotted line in the figure. The electronic component attachment area 214 is the area on the substrate that will be covered by an electronic component (when viewed from above) when the electronic component is coupled to the substrate 210. Disposed within the electronic component attachment area 214 on the substrate 210 are electrically conductive terminals (not shown), such as an array of pads or lands that are arranged to mate with a corresponding array of terminals formed on the electronic component (e.g., to be flip-chip mounted on the substrate 210). Conductive terminals may comprise copper (or a copper alloy or other metal) pads. It should be understood that the disclosed embodiments are not limited to substrates adapted for flip-chip bonding and, further, that electrically conductive terminals may comprise any type of terminal or element that may be used to form an electrical connection with an electronic component (e.g., bond pads for wire bonding, etc.).

The substrate 210 can also have an electronic component region 215. The electronic component region 215 is shown bounded by a dotted line in FIG. 3 and represents a boundary of where underfill material may flow or spread on the substrate 210 during subsequent processing. The electronic component attachment area 214 is typically within the electronic component region 215, and therefore the electronic component may be mounted on the substrate 210 within the electronic component region 215. The area between the dotted lines representing the electronic component region 215 and the electronic component attachment area 214 may be referred to as an underfill KOZ 216.

Figure 4:
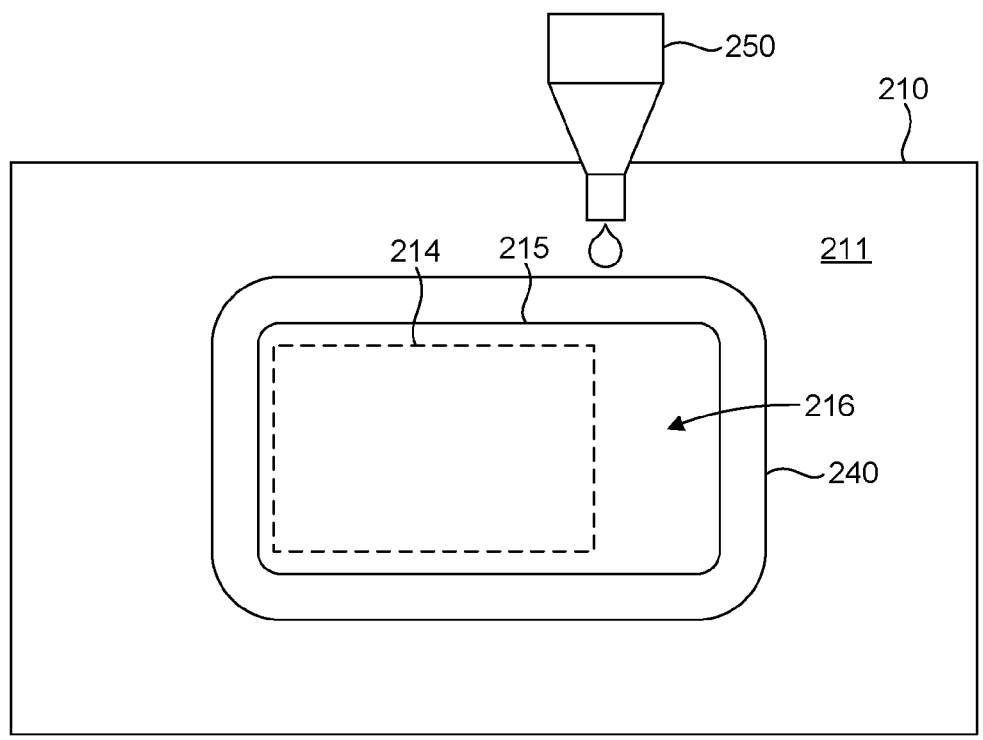
FIG. 4 illustrates dispensing material on the substrate of FIG. 3 to form a barrier in accordance with an example of a method for making an electronic device package.

As seen in the top view of FIG. 4, a barrier 240 can be formed on a surface 211 of the substrate 210 about at least a portion of the electronic component region 215. The barrier 240 can control the flow and spread of an underfill material and, hence, inhibit the flow of the underfill material and thereby establish or maintain the underfill KOZ 216 on the substrate surface. By physically blocking or damming underfill flow, the size and boundaries of the KOZ 216 can be minimized and maintained, which may be beneficial for small form factor packages.

The barrier 240 can comprise any structure suitable for physically blocking the flow and spread of an underfill material. In one embodiment, the barrier 240 can be arranged in a pattern that at least partially defines KOZ 216 or that otherwise mechanically inhibits or prevents the flow or spread of underfill material beyond the KOZ 216. For example, as shown in FIG. 4, the barrier 240 may be arranged in a pattern that fully surrounds (or at least substantially surrounds) a perimeter of the electronic component region 215. In another example, the barrier 240 can be arranged about fewer than all sides of the electronic component region 215, such as in a single bead or line along one side of the electronic component region 215, to at least partially define the KOZ 216. It should be understood that the barrier 240 may be arranged in any desired pattern or configuration, and the pattern that is used may be a function of several factors (e.g., the package form factor, die size, underfill viscosity, the process flow, etc.). In addition, the barrier 240 can be formed to have any suitable dimension (e.g., wall height and width). If needed, a subsequent process (e.g., a scanning laser burning/ablation process) can be used to re-shape the barrier 240 to achieve required dimensions.

As discussed in more detail below, the barrier 240 can be formed of a material that facilitates removal of the barrier once the underfill material has cured or solidified. Thus, the barrier 240 may be made of a sacrificial material that is thermally decomposable or liquid (e.g., water), or gas, soluble, for example. The barrier 240 can be formed by disposing material on the surface 211 of the substrate 210 utilizing any suitable process or technique. For example, as illustrated in FIG. 4, the barrier 240 can be formed by dispensing material (e.g., sacrificial material) on the surface 211 of the substrate 210, such as with a needle or nozzle dispenser 250. The needle or nozzle dispenser 250 can be moved relative to the substrate 210 to trace out the desired pattern of the barrier 240. In one aspect, the needle or nozzle dispenser 250 may be made of material that is non-wet to sacrificial materials or is surface coated with a non-wet material.

Figure 5:
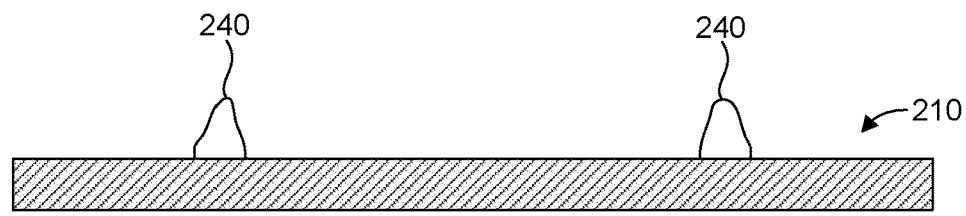
FIG. 5 illustrates a schematic representation of a side cross-sectional view of a substrate with a barrier disposed thereon in accordance with an example of a method for making an electronic device package.
Figure 6:
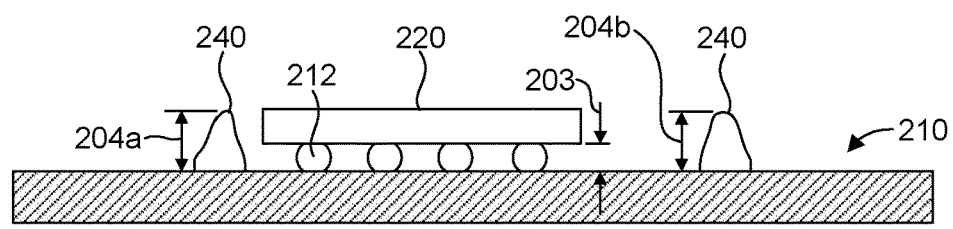
FIG. 6 illustrates a schematic representation of a side cross-sectional view of a substrate with a barrier and an electronic component disposed thereon in accordance with an example of a method for making an electronic device package.

It should be recognized that the barrier 240 can be formed prior to or after an electronic component has been disposed on the substrate 210. For example, FIG. 5 illustrates a side view of the barrier 240 on the substrate 210 without an electronic component, and FIG. 6 illustrates a side view of the barrier 240 on the substrate 210 with an electronic component 220 that may have been disposed on the substrate 210 before or after the formation of the barrier 240. Accordingly, in one aspect, FIG. 5 illustrates an electronic device package precursor, which includes a substrate having an electronic component region as described above, and a sacrificial material disposed on the substrate to form a barrier about at least a portion of the electronic component region to mechanically inhibit flow of an underfill material. In another aspect, FIG. 6 illustrates an electronic device package precursor that further includes an electronic component disposed on the substrate and electrically coupled to the substrate, such as through solder bumps 212. Each of these electronic device package precursors can be subjected to further processing to create an electronic device package in accordance with the present disclosure as described below.

Figure 7:
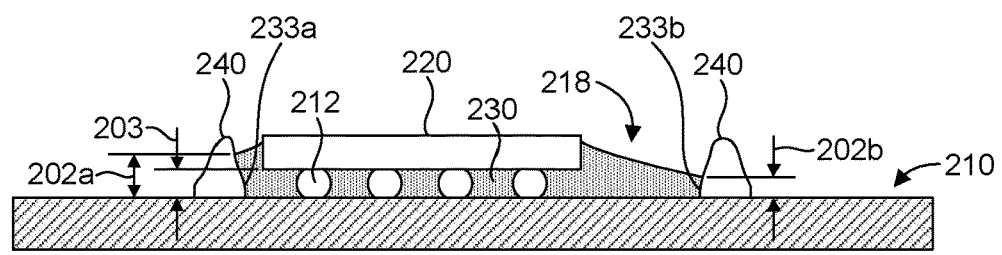
FIG. 7 illustrates a schematic representation of a side cross-sectional view of underfill material disposed between an electronic component and a substrate and bounded by a barrier in accordance with an example of a method for making an electronic device package.

For example, as shown in FIG. 7, underfill material 230 can be disposed at least partially between the electronic component 220 and the substrate 210. The underfill material 230 can be disposed between the electronic component 220 and the substrate 210 utilizing any suitable process or technique, such as dispensing. Typically, the underfill material 230 would be dispensed onto the substrate 210 in a region 218 between the barrier 240 and a lateral side of the electronic component 220. The underfill material 230 may flow between the electronic component 220 and the substrate 210 using capillary action.

The underfill material 230 can form a mechanical bond between the electronic component 220 and the substrate 210, and may also provide support to, and increase the strength of, the electrical connection formed by the solder bumps 212. The underfill material 230 may comprise any material capable of performing one or more of the above-described as well as other functions. In one embodiment, the underfill material 230 comprises an epoxy, such as a polymer epoxy. When formed from an epoxy material, the underfill material 230 is then typically cured to harden the polymer.

As shown in FIG. 7, the barrier 240 mechanically inhibits the flow of the underfill material 230. For example, in the illustrated embodiment, the underfill material 230 can flow or spread across the substrate 210 surface up to the barrier 240, but the barrier 240 dams or blocks the continued outward flow of the underfill material 230. In one aspect, the barrier 240 can be configured such that the underfill material 230 does not cross over the barrier 240. For example, as shown in FIG. 6, a height 204a, 204b of the barrier 240 from the substrate 210 is greater than a gap 203 between the electronic component 220 and the substrate 210. With such a barrier configuration, when the underfill material 230 is disposed between the electronic component 220 and the substrate 210, as shown in FIG. 7, flow of the underfill material 230 is mechanically inhibited or physically blocked by the barrier 240. Thus, as shown in FIG. 7, a lateral surface 233a can extend away from the substrate 210, and a height 202a of the lateral surface 233a from the substrate is greater than the gap 203 between the electronic component 220 and the substrate 210. The height 202a of the lateral surface 233a may differ from a height 202b of a lateral surface 233b extending from the substrate 210 on another side of the electronic component 220. Such a height difference may be due to the relative spacing between the barrier 240 and the electronic component 220 on the different sides of the electronic component. Such spacing differences may exist for any reason, such as to provide a suitable space or region 218 in which to deposit or dispense the underfill material 230 between the barrier 240 and the electronic component 220.

In one aspect, FIG. 7 also illustrates an electronic device package precursor, which in this case further includes the underfill material 230 disposed at least partially between the electronic component 220 and the substrate 210. The underfill material 230 has a lateral surface 233a, 233b defined at least in part by the barrier 240.

The barrier 240 may be positioned to permit whatever amount of spreading of the underfill material 230 is desired. For example, in certain applications, it may be useful to have the underfill material 230 spread a small, uniform distance outward from the electronic component attachment area, for protection. In other applications it may be useful to minimize or have no underfill spread beyond the electronic component attachment area, or to provide for different amounts of underfill spread on different sides of the electronic component attachment area. By controlling or limiting the extent of the flow of the underfill material 230 using the barrier 240, the size and boundary of the underfill KOZ can be minimized and/or maintained.

It should be appreciated that the exact position and shape of the barrier 240 may be varied from that shown in FIGS. 4-7. Depending on factors including, for example, the size of the substrate and the presence of other structures on the substrate, the underfill KOZ can be configured to any desired shape and any desired size outside of the electronic component attachment area (even down to zero on all sides), by controlling the location, shape, and size of the barrier 240 formed outside of the electronic component attachment area. In one embodiment, the barrier may be formed along one side, two sides, three sides, or four sides of the electronic component. In some cases, the barrier may be form an open perimeter and in other cases the barrier may form a closed perimeter. In an additional embodiment, the barrier can take any shape required in order to achieve a specific result, such as rectangular, square, circular, oval, pentagonal, hexagonal, octagonal, or the like. The barrier can also be formed to any thickness, height, or cross-sectional shape or configuration desired. It should also be appreciated that the electronic component attachment area may have multiple configurations, for example, more or less than four sides, depending on the shape of the electronic component.

In one aspect, a barrier can be used to mechanically inhibit or block the flow or spread of underfill material associated with multiple electronic components. For example, a barrier can be disposed between two electronic components, which are located on opposite sides of the barrier. The barrier can therefore be utilized to mechanically block or inhibit underfill material flow on opposing sides of the barrier. Thus, one barrier can be used to define or maintain keep out zones associated with multiple electronic components.

Figure 8:
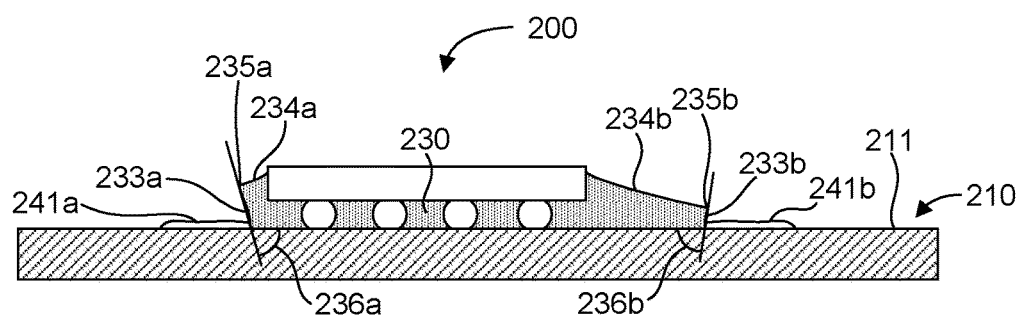
FIG. 8 illustrates a schematic representation of a side cross-sectional view of an electronic device package following removal of a barrier in accordance with an example of a method for making an electronic device package.

As shown in FIG. 8, once the underfill material has hardened sufficiently (e.g., cured), the barrier can be removed, which can result in a completed electronic device package 200. As mentioned above, the barrier can be formed or constructed of a sacrificial material that can facilitate removal of the barrier so that the underfill barrier has zero, or substantially zero, contribution to the underfill KOZ. For example, the sacrificial material may be thermally decomposed into a gas, such as at a relatively low temperature (e.g., just above underfill cure temperature) that will not affect or damage other components or features (e.g., the underfill, the electronic component, the substrate, etc.). Therefore, in this example, the barrier may be removed by heating the barrier to a temperature sufficient to thermally decompose or degrade the sacrificial material, while maintaining the temperature below that which would melt or otherwise harm neighboring components or materials. Some sacrificial materials can decompose to gases which can vent or diffuse through solid coatings by a thermal decomposition process. The decomposition temperature of such sacrificial materials can be from about 200 degrees C. to about 400 degrees C., for example, although other decomposition temperatures are possible. In another example, the sacrificial material may be soluble, such as by a fluid (e.g., liquid water). Therefore, in this example, the barrier may be removed by dissolving the sacrificial material in a fluid, such as water. Thus, some sacrificial materials can be removed by a wash or "deflux" operation, such as water soluble resin-type sacrificial materials.

Any suitable sacrificial material having any suitable attribute or characteristic may be utilized. For example, the sacrificial material may be brittle to readily facilitate cracking or breaking of the sacrificial material for mechanical removal of the barrier without damaging neighboring components. In another example, the sacrificial material may be flexible or elastic to facilitate peeling the barrier away from interfacing surfaces and materials without damage to the interfacing surfaces and materials. Some example sacrificial materials include water soluble flux resin, polyethylene carbonates, etc. In a particular example, Unity® sacrificial material by Promerus may be thermally removed. It should be understood, however, that other sacrificial materials may also find application to the disclosed embodiments.

By forming the barrier of sacrificial material and removing or eliminating the barrier, the barrier does not contribute or factor into the underfill KOZ, which would otherwise include the barrier's dimensions. The final shape of the underfill material 230, however, is directly influenced by the barrier, which physically contacts the underfill material and provides the lateral surfaces 233a, 233b with a shape formed by interfacing with the barrier. Thus, the electronic device package 200 will have features and attributes that indicate the former presence of the barrier. For example, the lateral surfaces 233a, 233b will be oriented at angles 236a, 236b relative to the substrate surface 211 related to the corresponding angles of the barrier. Depending on the geometry of the barrier, the angles 236a, 236b may be less than 90 degrees, although other angles are possible. In addition, the barrier surfaces that interface with the underfill material 230 may be uneven or irregular due to the manner in which the barrier was constructed, which will also be evident on the lateral surfaces 233a, 233b. As mentioned above, the underfill material 230 can have edges 235a, 235b between the lateral surfaces 233a, 233b and meniscus surfaces 234a, 234b, respectively, of the underfill material 230. Such features are characteristics of an underfill material formed by a barrier that was subsequently removed. Furthermore, removal of the barrier may leave a residue 241a, 241b (e.g., remains or traces) of the barrier behind on the structures that were in contact with the barrier. For example, sacrificial material (e.g., a water soluble flux resin, polyethylene carbonates, etc.) may leave a trace or residue on the substrate 210 and/or the underfill material 230 following removal of the barrier. Additionally, certain additives in the sacrificial material (e.g., surfactant additives) that serve to accelerate the decomposition of the material can leave a residue (e.g., a stain or other discoloration) on surfaces in contact with the material, such as portions of the substrate and/or the underfill material.

Figure 9:
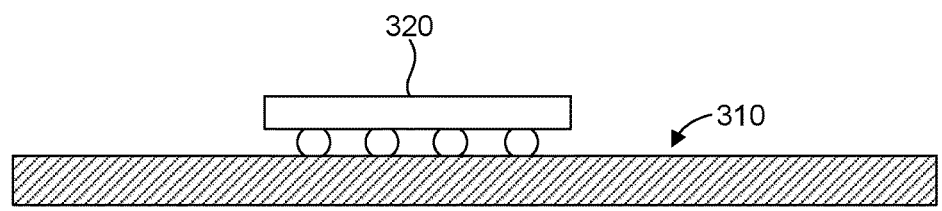
FIG. 9 illustrates a schematic representation of a side cross-sectional view of a substrate and an electronic component disposed thereon in accordance with an example of a method for making an electronic device package.
Figure 10:
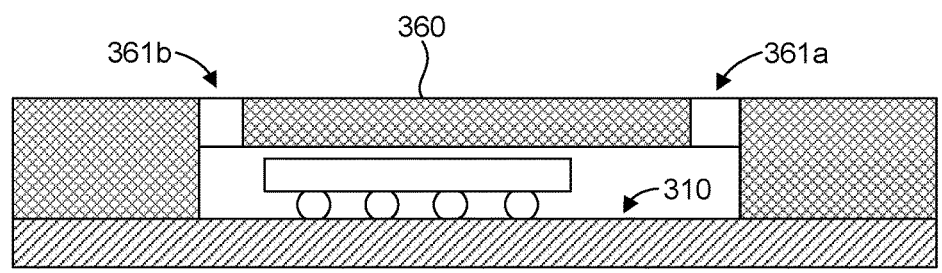
FIG. 10 illustrates a schematic representation of a side cross-sectional view of a printing stencil disposed on a substrate in accordance with an example of a method for making an electronic device package.
Figure 11:
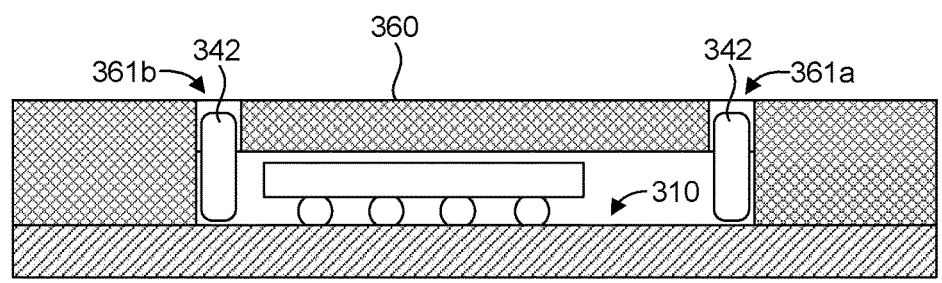
FIG. 11 illustrates a schematic representation of a side cross-sectional view of material transferred through a printing stencil to form a barrier on a substrate about an electronic component in accordance with an example of a method for making an electronic device package.
Figure 12:
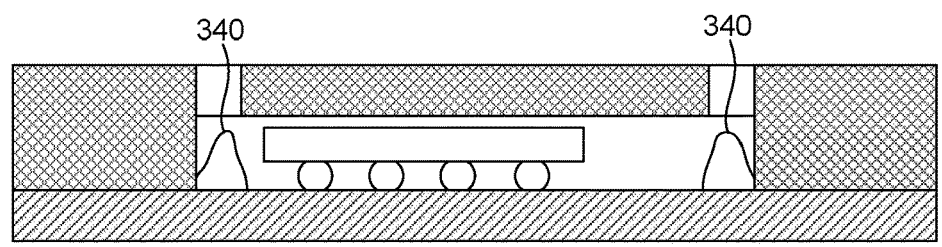
FIG. 12 illustrates a schematic representation of a side cross-sectional view of a barrier formed on a substrate about an electronic component in accordance with an example of a method for making an electronic device package.

FIGS. 9-12 schematically illustrate aspects of another process or technique for disposing material on a surface of a substrate to form a barrier as disclosed herein. In this case, the barrier is formed by printing a material (e.g., sacrificial material) on the surface of the substrate. For example, as illustrated in FIG. 9, an electronic component 320 can be coupled to a substrate 310 prior to forming a barrier, although it should be recognized that the electronic component 320 can be coupled to the substrate 310 after the formation of a barrier. A stencil 360 can be disposed about the substrate 310, as shown in FIG. 10. The stencil 360 can have an aperture or opening 361a, 361b corresponding to a location of the barrier to be formed. The stencil aperture or opening 361a, 361b can be configured with any suitable number of apertures or openings, such as an array or network of small holes to allow material to pass through the stencil 360 onto the substrate 310 in a suitable arrangement or configuration to form a barrier. The stencil aperture or opening 361a, 361b can be located about an entire periphery of the electronic component or an electronic component attachment region, or about only a portion of the electronic component or electronic component attachment region. FIG. 11 illustrates sacrificial material 342 passing through the aperture or opening 361a, 361b in the stencil 360 and transferred onto the substrate 310 to form a barrier 340, as shown in FIG. 12. The location, size, and/or height of the barrier 340 on the substrate 310 may be determined by the accuracy of the printing placement, volume, process settings, and designs of the stencil 360. The stencil 360 may be made of material that is non-wet to sacrificial materials or is surface coated with a non-wet material. With the barrier 340 in place, the stencil 360 can be removed to provide an electronic device package precursor as in FIG. 6 if an electronic component has already been coupled to the substrate, or an electronic device package precursor as in FIG. 5 if an electronic component has not been coupled to the substrate. In either case, with the stencil removed, the sacrificial material can be dried in preparation for application of an underfill material as discussed above.

It should be recognized that any suitable process or technique may be utilized to form a barrier, such as with a sacrificial material. In addition to the examples provided above, a pattern of a barrier may be created by forming a mask over the substrate and then applying a layer of sacrificial material by spin coating (or other blanket deposition technique). It should be appreciated that other processes and/or devices may be used to form the desired pattern of barrier material on a substrate.

Figure 13:
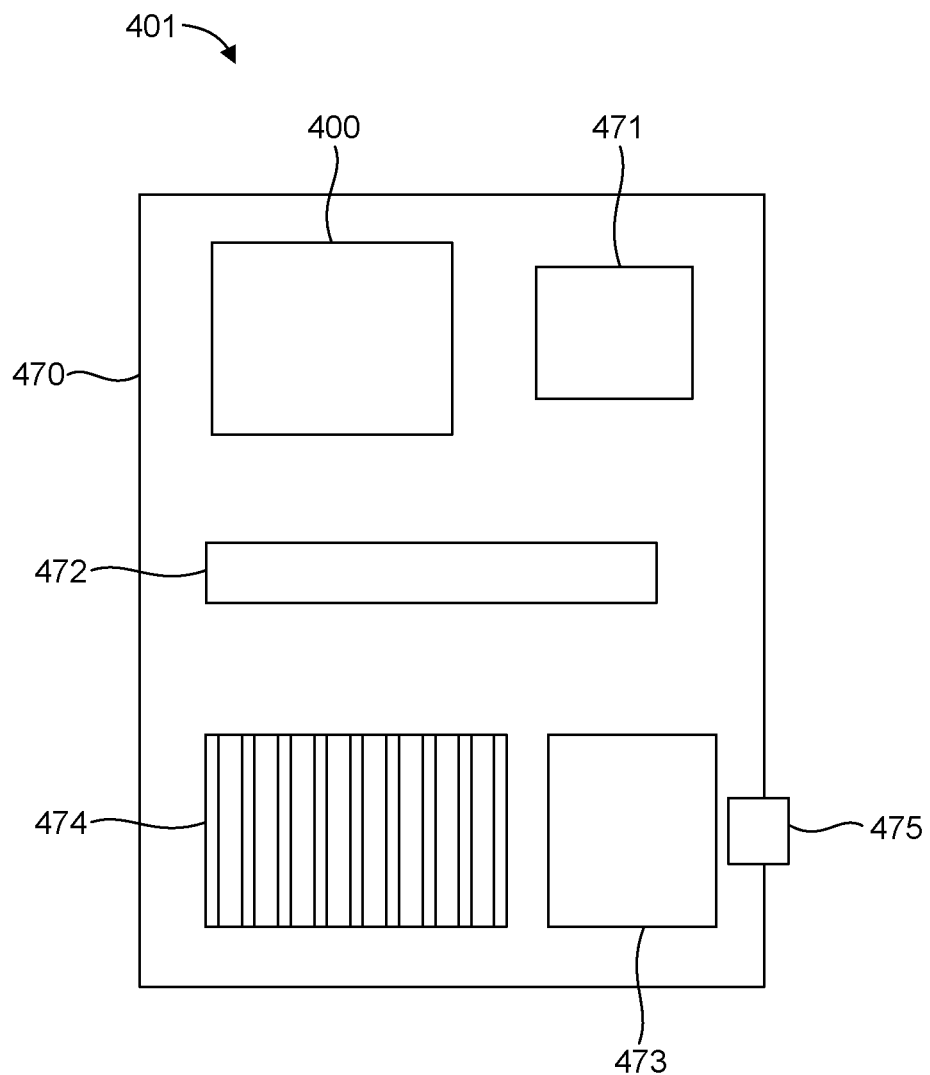
FIG. 13 is a schematic illustration of an exemplary computing system.

FIG. 13 illustrates an example computing system 401. The computing system 401 can include an electronic device package 400 as disclosed herein, coupled to a motherboard 470. In one aspect, the computing system 401 can also include a processor 471, a memory device 472, a radio 473, a heat sink 474, a port 475, a slot, or any other suitable device or component, which can be operably coupled to the motherboard 470. The computing system 401 can comprise any type of computing system, such as a desktop computer, a laptop computer, a tablet computer, a smartphone, a server, etc. Other embodiments need not include all of the features specified in FIG. 13, and may include alternative features not specified in FIG. 13.

Examples

The following examples pertain to further embodiments.

In one example there is provided, an electronic device package comprising a substrate, an electronic component disposed on the substrate and electrically coupled to the substrate, and an underfill material disposed at least partially between the electronic component and the substrate, wherein a lateral portion of the underfill material comprises a lateral surface extending away from the substrate and intersecting a meniscus surface extending between the lateral surface and the electronic component.

In one example of an electronic device package, the lateral surface is exposed.

In one example of an electronic device package, an intersection of the meniscus surface and the lateral surface defines an edge.

In one example of an electronic device package, the lateral surface comprises an irregular surface.

In one example of an electronic device package, a height of the lateral surface from the substrate is greater than a gap between the electronic component and the substrate.

In one example of an electronic device package, the electronic component comprises a semiconductor device.

In one example of an electronic device package, the electronic component is coupled to the substrate through a plurality of solder bumps.

In one example there is provided, an electronic device package comprising a substrate, an electronic component disposed on the substrate and electrically coupled to the substrate, and an underfill material disposed at least partially between the electronic component and the substrate, wherein a lateral portion of the underfill material extends from a lateral side of the electronic component to the substrate, the lateral portion of the underfill material having an edge between two surfaces of the underfill material.

In one example of an electronic device package, one of the two surfaces of the underfill material comprises a lateral surface that extends from the substrate.

In one example of an electronic device package, the lateral surface is exposed.

In one example of an electronic device package, the lateral surface comprises an irregular surface.

In one example of an electronic device package, a height of the lateral surface from the substrate is greater than a gap between the electronic component and the substrate.

In one example of an electronic device package, the electronic component comprises a semiconductor device.

In one example of an electronic device package, the electronic component is coupled to the substrate through a plurality of solder bumps.

In one example there is provided, an electronic device package comprising a substrate, an electronic component disposed on the substrate and electrically coupled to the substrate, an underfill material disposed at least partially between the electronic component and the substrate, the underfill material having a lateral portion that extends from a lateral side of the electronic component to the substrate, and a sacrificial material residue remaining from a barrier on at least one of the substrate and the lateral portion of the underfill material.

In one example of an electronic device package, the lateral portion of the underfill material comprises a lateral surface extending away from the substrate and a meniscus surface extending between the lateral surface and the electronic component.

In one example of an electronic device package, the sacrificial material residue remains on the lateral surface.

In one example of an electronic device package, the lateral surface is exposed.

In one example of an electronic device package, an interface of the meniscus surface and the lateral surface defines an edge.

In one example of an electronic device package, the lateral surface comprises an irregular surface.

In one example of an electronic device package, a height of the lateral surface from the substrate is greater than a gap between the electronic component and the substrate.

In one example of an electronic device package, the electronic component comprises a semiconductor device.

In one example of an electronic device package, the electronic component is coupled to the substrate through a plurality of solder bumps.

In one example, there is provided a computing system comprising a motherboard, and an electronic device package as disclosed herein operably coupled to the motherboard.

In one example of a computing system, the computing system comprises a desktop computer, a laptop, a tablet, a smartphone, a server, or a combination thereof.

In one example of a computing system, the computing system further comprises a processor, a memory device, a heat sink, a radio, a slot, a port, or a combination thereof operably coupled to the motherboard.

In one example, there is provided an electronic device package precursor comprising a substrate having an electronic component region, and a sacrificial material disposed on the substrate to form a barrier about at least a portion of the electronic component region to mechanically inhibit flow of an underfill material.

In one example of an electronic device package precursor, a height of the sacrificial material from the substrate is greater than a gap between the electronic component and the substrate.

In one example, an electronic device package precursor further comprises an electronic component disposed on the substrate and electrically coupled to the substrate.

In one example of an electronic device package precursor, the electronic component comprises a semiconductor device.

In one example of an electronic device package precursor, the electronic component is coupled to the substrate through a plurality of solder bumps.

In one example, an electronic device package precursor further comprises the underfill material disposed at least partially between the electronic component and the substrate, the underfill material having a lateral surface defined at least in part by the sacrificial material.

In one example of an electronic device package precursor, the lateral surface extends away from the substrate, and a height of the lateral surface from the substrate is greater than a gap between the electronic component and the substrate.

In one example of an electronic device package precursor, the sacrificial material is thermally decomposable.

In one example of an electronic device package precursor, the sacrificial material is water soluble.

In one example there is provided a method for making an electronic device package comprising disposing an electronic component on a substrate, such that the electronic component is electrically coupled to the substrate, forming a barrier with a sacrificial material about at least a portion of the electronic component, disposing an underfill material at least partially between the electronic component and the substrate, wherein flow of the underfill material is mechanically inhibited at least partially by the barrier, and removing the barrier.

In one example of a method for making an electronic device package, forming the barrier comprises dispensing the sacrificial material on the substrate.

In one example of a method for making an electronic device package, forming the barrier comprises printing the sacrificial material on the substrate.

In one example of a method for making an electronic device package, printing the sacrificial material on the substrate comprises disposing a stencil about the substrate, the stencil having an aperture corresponding to a location of the barrier.

In one example of a method for making an electronic device package, printing the sacrificial material on the substrate further comprises causing the sacrificial material to pass through the aperture and onto the substrate.

In one example of a method for making an electronic device package, printing the sacrificial material on the substrate further comprises removing the stencil.

In one example of a method for making an electronic device package, printing the sacrificial material on the substrate further comprises drying the sacrificial material.

In one example of a method for making an electronic device package, removing the barrier comprises heating the sacrificial material.

In one example of a method for making an electronic device package, the sacrificial material is thermally decomposed.

In one example of a method for making an electronic device package, removing the barrier comprises dissolving the sacrificial material.

In one example of a method for making an electronic device package, the sacrificial material is water soluble.

In one example there is provided a method for making an electronic device package comprising obtaining a substrate having an electronic component region, and a sacrificial material on the substrate forming a barrier about at least a portion of the electronic component region, disposing an electronic component on a substrate in the electronic component region, such that the electronic component is electrically coupled to the substrate, disposing an underfill material at least partially between the electronic component and the substrate, wherein flow of the underfill material is mechanically inhibited at least partially by the barrier, and removing the barrier.

In one example of a method for making an electronic device package, removing the barrier comprises heating the sacrificial material.

In one example of a method for making an electronic device package, the sacrificial material is thermally decomposed.

In one example of a method for making an electronic device package, removing the barrier comprises dissolving the sacrificial material.

In one example of a method for making an electronic device package, the sacrificial material is water soluble.

In one example there is provided a method for facilitating an underfill material keep out zone (KOZ) of an electronic component comprising obtaining a substrate having an electronic component region, and disposing a sacrificial material on the substrate to form a barrier about at least a portion of the electronic component region to mechanically inhibit flow of an underfill material.

In one example of a method for facilitating an underfill KOZ of an electronic component, disposing a sacrificial material on the substrate comprises dispensing the sacrificial material on the substrate.

In one example of a method for facilitating an underfill KOZ of an electronic component, disposing a sacrificial material on the substrate comprises printing the sacrificial material on the substrate.

In one example of a method for facilitating an underfill KOZ of an electronic component, printing the sacrificial material on the substrate comprises disposing a stencil about the substrate, the stencil having an aperture corresponding to a location of the barrier.

In one example of a method for facilitating an underfill KOZ of an electronic component, printing the sacrificial material on the substrate further comprises causing the sacrificial material to pass through the aperture and onto the substrate.

In one example of a method for facilitating an underfill KOZ of an electronic component, printing the sacrificial material on the substrate further comprises removing the stencil.

In one example of a method for facilitating an underfill KOZ of an electronic component, printing the sacrificial material on the substrate further comprises drying the sacrificial material.

In one example of a method for facilitating an underfill KOZ of an electronic component, the sacrificial material is thermally decomposable.

In one example of a method for facilitating an underfill KOZ of an electronic component, the sacrificial material is water soluble.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
    a substrate;
    an electronic component disposed on the substrate and electrically coupled to the substrate; and
    an underfill material disposed at least partially between the electronic component and the substrate, wherein a lateral portion of the underfill material comprises an exposed lateral surface extending away from the substrate and intersecting a meniscus surface extending between the lateral surface and the electronic component, wherein a height of the lateral surface from the substrate is greater than a length of the meniscus surface, and wherein the lateral surface comprises an irregular surface that has a concavity from an upper surface of the substrate.

2. The electronic device package of claim 1, wherein an intersection of the meniscus surface and the lateral surface defines an edge.

3. The electronic device package of claim 1, wherein a height of the lateral surface from the substrate is greater than a gap between the electronic component and the substrate.

4. The electronic device package of claim 1, wherein the electronic component comprises a semiconductor device.

5. The electronic device package of claim 1, wherein the electronic component is coupled to the substrate through a plurality of solder bumps.

6. An electronic device package, comprising:
a substrate;
an electronic component disposed on the substrate and electrically coupled to the substrate; and
an underfill material disposed at least partially between the electronic component and the substrate, wherein a lateral portion of the underfill material extends from a lateral side of the electronic component to the substrate, the lateral portion of the underfill material having an edge between two surfaces of the underfill material, wherein one of the two surfaces of the underfill material comprises an exposed lateral surface that extends from the substrate, and the other of the two surfaces of the underfill material comprises a meniscus surface, wherein a height of the lateral surface from the substrate is greater than a length of the meniscus surface, and wherein the lateral surface comprises an irregular surface that has a concavity from an upper surface of the substrate.

7. The electronic device package of claim 6, wherein a height of the lateral surface from the substrate is greater than a gap between the electronic component and the substrate.

8. The electronic device package of claim 6, wherein the electronic component comprises a semiconductor device.

9. The electronic device package of claim 6, wherein the electronic component is coupled to the substrate through a plurality of solder bumps.

* * * * *